(12) United States Patent
Wainwright et al.

(10) Patent No.: US 7,061,766 B2
(45) Date of Patent: Jun. 13, 2006

(54) COMBINATION IGBT MOUNTING METHOD

(75) Inventors: Richard E. Wainwright, Racine, WI (US); James K. Kersting, Kenosha, WI (US)

(73) Assignee: Hamilton Sunstrand Corporation, Windsor Locks, CT (US)

( * ) Notice: Subject to any disclaimer, the term of this patent is extended or adjusted under 35 U.S.C. 154(b) by 79 days.

(21) Appl. No.: 10/949,879

(22) Filed: Sep. 23, 2004

(65) Prior Publication Data

US 2006/0061973 A1    Mar. 23, 2006

(51) Int. Cl.
H05K 7/20 (2006.01)

(52) U.S. Cl. ............... 361/719; 361/752; 361/753; 165/80.3

(58) Field of Classification Search ............ 361/742, 361/752, 758, 719, 717, 718, 720, 704, 707; 165/80.2, 80.3, 185; 174/51, 138 G, 35 GC, 174/35 G, 35 R, 138 E; 257/718, 719, 726, 257/727
See application file for complete search history.

(56) References Cited

U.S. PATENT DOCUMENTS

| | | | | |
|---|---|---|---|---|
| 5,227,631 A | * | 7/1993 | Hunter et al. | 250/352 |
| 5,608,611 A | * | 3/1997 | Szudarek et al. | 361/753 |
| 6,181,561 B1 | * | 1/2001 | Albrecht et al. | 361/719 |
| 6,280,202 B1 | * | 8/2001 | Alden et al. | 439/66 |
| 6,377,461 B1 | * | 4/2002 | Ozmat et al. | 361/704 |
| 6,483,708 B1 | * | 11/2002 | Ali et al. | 361/719 |
| 6,493,233 B1 | * | 12/2002 | De Lorenzo et al. | 361/752 |
| 6,771,507 B1 | * | 8/2004 | Belady et al. | 361/704 |
| 6,839,240 B1 | * | 1/2005 | Skofljanec et al. | 361/752 |

* cited by examiner

*Primary Examiner*—Michael Datskovskiy
(74) *Attorney, Agent, or Firm*—Kinney & Lange, P.A.

(57) ABSTRACT

A system and method for providing a mechanical joint supporting a printed circuit board and a solder joint of power module terminals to a printed circuit board, as well as a mechanical joint for facilitating a thermal interface between a power module and a heat sink or cold plate is disclosed. The system provides for both mechanical joints through a common mechanical support including a plurality of stand-offs mounted to studs projecting from a heat sink or cold plate, wherein the assembly also provides for an insulating spacer to be clamped to the standoffs via a wing nut or similar fastener to support the printed circuit board.

4 Claims, 3 Drawing Sheets

US 7,061,766 B2

COMBINATION IGBT MOUNTING METHOD

BACKGROUND OF THE INVENTION

The field of the present invention relates to mechanical contacts and support for printed circuit board (PCB) mountable power modules such as rectifiers, MOSFETs and IGBTs. More specifically, the present invention relates to a system and method of supporting a plurality of mechanical joints through a common mechanical support, i.e., a support which clamps the module to its thermal interface and clamps the PCB to the module.

Current PCB mountable power modules often require two separate points of mechanical contact or support. The first of these two mechanical joints involves a thermal interface of the module to secure a base plate to a heat sink or cold plate. The second of these two mechanical joints involves a solder joint of module terminals to a printed circuit board (PCB) and support of the board.

Typically the thermal interface is addressed by the use of fasteners and/or washers, which secure the base plate or substrate of a power module/device to a heat sink or cold plate. This fulfills the requirements of the first mechanical joint, but the second mechanical joint, which involves the support of the PCB, is left to the solder joint. Through applications of environmental stress like thermal stresses, where there may be a temperature mismatch of materials, or vibrational stresses, there can be enough resulting mechanical stress placed on either the solder terminal joint directly or transferred through the solder-terminal joint to the substrate-terminal joint that this electrical connection will fail. Prior approaches for modules that have features for fasteners through the board and into the shell of the module cause the loss of valuable board space by the additional holes and voltage clearance issues introduced by these additional fasteners.

Thus, there is a need for a system and method of assembly for mechanical contacts and support for PCB mounted power modules which provides the support of both mechanical joints through a common mechanical support by clamping the power module to its thermal interface and clamping the PCB to the module.

Further, there is a need for a system and method of mounting power modules on a PCB which minimizes the use of PCB space in the support of such power modules.

In addition, there is a need for a system and method of installation of mounting power modules on a PCB which uses a simplified design to reduce assembly time.

SUMMARY OF THE INVENTION

The system and method of the present invention uses a heat sink or cold plate, with studs, which are positioned in the center of each module's mounting hole. The invention further uses a standoff of sufficient width to span the diameter of the module's mounting hole and to provide sufficient clamping area for fastening. The standoff will include a mating thread to attach to the stud on the heat sink or cold plate. The standoff will also be of sufficient length to allow a tool to drive the standoff onto the stud at a controlled torque to ensure a strong thermal interface, thus providing the first mechanical joint referenced above. Next, the invention includes an insulating spacer or washer with an inner diameter greater than the standoff so as to surround the standoff, and an outer diameter greater than the clearance hole in the PCB. Finally, the system includes a wing-nut or spring washer and screw or similar fastener to clamp the spacer/washer to the PCB via the standoff, thus providing the second mechanical joint and support referenced above.

Thus, the present invention provides a common support structure for attaching the base plate of a power module to a heat sink or cold plate, while the same support structure assembly provides support of the PCB itself.

BRIEF DESCRIPTION OF THE PREFERRED EMBODIMENT

Figure 1:
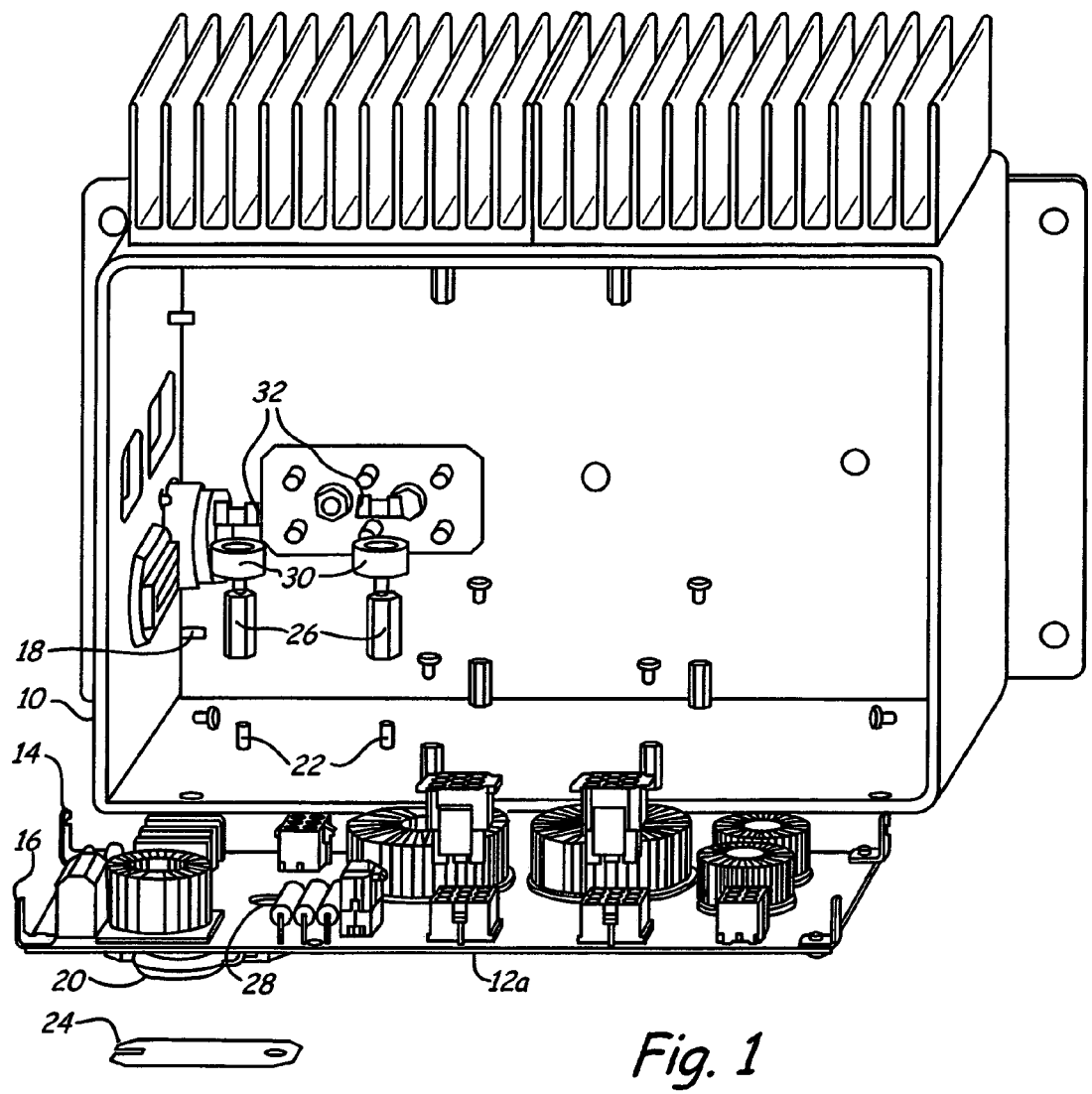
FIG. 1 is a perspective drawing of an embodiment of the present invention during assembly showing an exploded view of the IGBT thermal interface pad, the standoffs, the spacers and the wing nuts, along with a slotted bracket feature for further mounting a printed circuit board within an enclosure per the present invention.

Referring to FIG. 1, the present invention is most preferably used with an enclosure 10, where component space and access for an assembler is limited. The enclosure 10 houses one or more printed circuit boards (PCBs) 12a–12c, each of which has a pair of lower slotted brackets 14 and a pair of upper brackets 16. The lower slotted brackets 14 are slotted so as to slidingly engage bracket studs 18 protruding from the sides of the enclosure 10. The bracket studs 18 will support the slotted brackets 14, and the board can then be rotated into place whereby the upper brackets align with preconfigured holes in the sides of the enclosure 10 whereby fasteners (not shown) such as screws can secure the upper brackets to the sides of the enclosure. Thus, with this arrangement, the assembler need not get access to the bottom corners of the enclosure to insert screws or similar fasteners to install (or replace) PCBs.

However, with the PCB installation approach as outlined above, it is desirable to further attach the PCB to the enclosure through the use of a combined PCB support connection and thermal interface connection for a power module 20 connected to the board 12. In a first preferred embodiment of the present invention, the enclosure 10 includes heat sink studs 22 protruding into the enclosure in a direction generally perpendicular to the plane of the printed circuit board 12. The heat sink studs 22 are preferably positioned in the mounting hole of a given module (e.g., a rectifier, MOSFET or IGBT). In this preferred embodiment, the power module 20 is an insulated gate bipolar transistor (IGBT), although those of ordinary skill in the art will appreciate that the present invention is equally applicable to a wide variety of PCB mountable power modules. This preferred embodiment of the heat sink or cold plate of the module further includes IGBT thermal interface pads 24, each of which includes mounting holes or apertures for surrounding the heat sink studs 22.

The invention includes a series of standoffs 26. In this preferred embodiment, hex standoffs 26 are used, although one of ordinary skill in the art will understand that other types of supports are encompassed and may practice the present invention. The standoffs 26 are ideally of sufficient width to span the diameter of a mounting hole for the module 20 and most preferably will have a mating thread to the heat sink studs 22. Furthermore, the standoff 26 will have sufficient length to allow a tool to drive the standoff onto the stud at a controlled torque to ensure a strong thermal interface between module 20 and the heat sink or cold plate.

Figure 2:
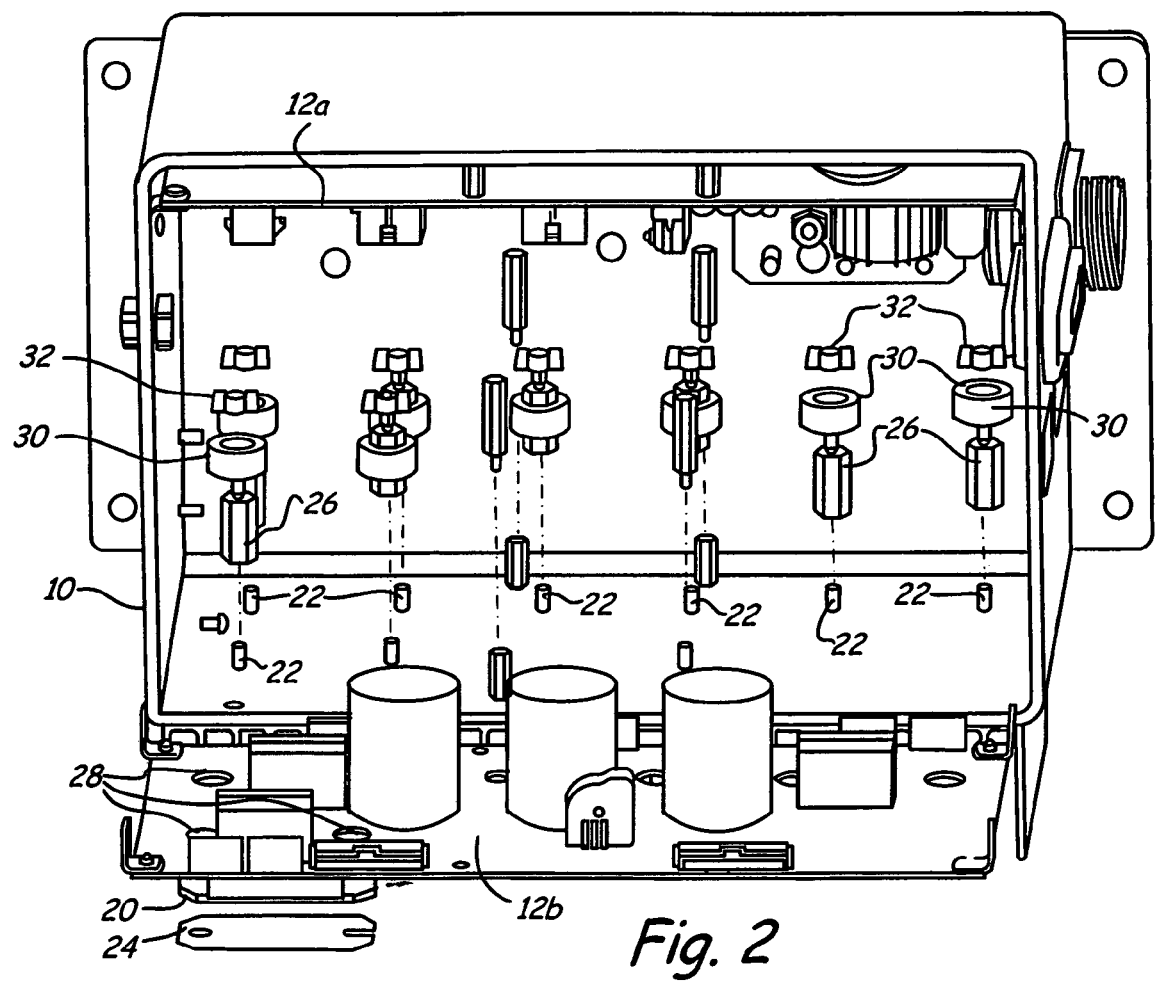
FIG. 2 is a perspective drawing of an embodiment of the present invention during assembly showing an exploded example of further standoff, spacer and wing nut assemblies to support a circuit board and to clamp a power module to provide a thermal interface as called for by the present invention.

As shown for instance in FIG. 2, the printed circuit board 12b includes a series of board apertures or clearance holes 28 which the standoffs 26 extend through. The portion of standoffs 26 extending through the apertures can mate with an insulating spacer 30, the spacer having an inside diameter greater than the standoff 26 and an outside diameter greater than the clearance hole 28 of the printed circuit board 12b. Preferably, the spacer 30 is comprised of plastic, and is used to secure the printed circuit board to the IGBT module, thus taking stress off the IGBT pins (not shown). Alternatively, those of ordinary skill in the art will understand that a washer or similar structure may be used in place of the spacer. The spacer 30 is clamped to the printed circuit board 12b via standoff 26 through the use of a locking wing nut 32. As with the spacer 30, the locking wing nut 32 is preferably made of plastic. Alternatively, those of ordinary skill in the art will understand that a similar fastener, such as a spring washer, may be used to clamp the spacer or washer to the printed circuit board.

Figure 3:
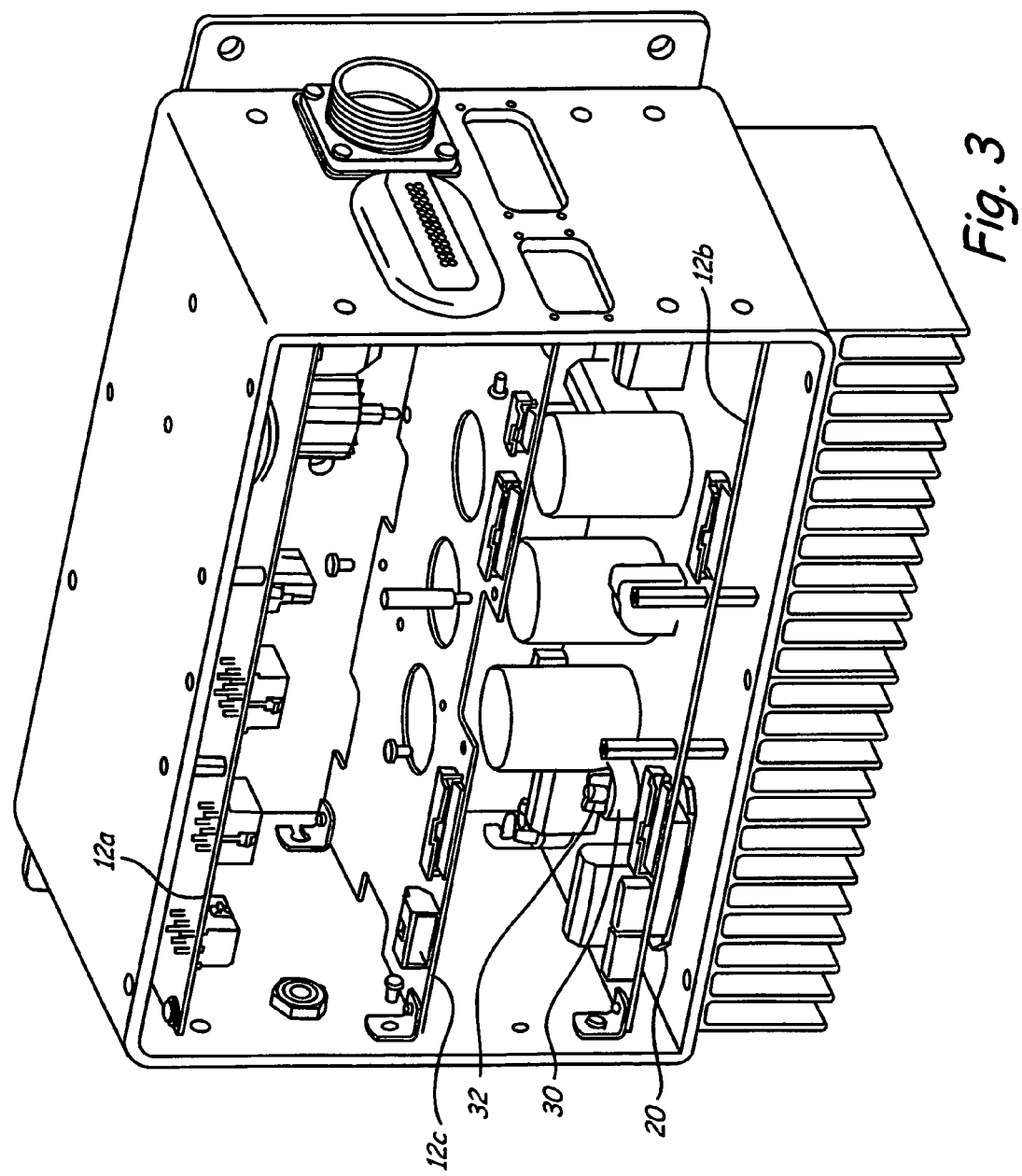
FIG. 3 is a perspective drawing of an embodiment of the present invention during a later point in assembly showing the spacer/standoff/wing nut assembly in place on a first circuit board in combination with a second circuit being lowered in place using a similar bracket mounting.

The standoff fastening arrangement is shown in some detail in FIG. 3. As can be seen in that picture, the diameter of the spacer 30, being larger than the clearance hole 28, provides a board support by the standoff 26 when clamped by the blocking wing nut 32, thus creating a mechanical joint. A second mechanical joint is created by the standoff which clamps the module to its thermal interface.

It will be appreciated by those skilled in the art that various changes, additions, omissions, and modifications can be made to the illustrated embodiments without departing from the spirit of the present invention. All such modifications and changes are intended to be covered by the following corresponding claim language.

We claim:

1. A support assembly for providing a support for a printed circuit board having a plurality of clearance holes, said support assembly further providing a thermal interface between a heat sink and a power module, said power module having a mounting hole and terminals for connection to said printed circuit board, said support assembly comprising:
   a) a heat sink, said heat sink including a plurality of studs, each of said studs positioned within said mounting holes of said power module;
   b) a plurality of standoffs having a first end and a second end, wherein the first end of each standoff mates with one of the plurality of studs and is positioned to span one of said mounting holes of said module and the second end of said standoffs further projecting through a clearance hole of said printed circuit board;
   c) an insulating spacer for mating with the second end of the printed circuit board, said spacer having an annular configuration with an inside diameter larger than the diameter of said standoffs, and an outside diameter greater than the diameter of said clearance hole of said circuit board; and
   d) a fastener for securing the insulating spacer to the printed circuit board, said fastener mating with the second end of said standoff;
   whereby said assembly provides a common mechanical support for both a mechanical joint supporting said circuit board and a mechanical joint between a power module and a heat sink.

2. The support assembly of claim 1 further comprising a pair of slotted brackets for rotatably engaging said printed circuit board for positioning within an enclosure.

3. The support assembly of claim 1, wherein said power module is an insulated gate bipolar transistor.

4. A support assembly for providing a support for a printed circuit board having a plurality of clearance holes, said support assembly further providing a thermal interface between a heat sink and a power module, said power module having a mounting hole and terminals for connection to said printed circuit board, said support assembly comprising:
   a) a heat sink, said heat sink including a plurality of studs, each of said studs positioned within said mounting holes of said power module;
   b) a plurality of standoffs having a first end and a second end, wherein the first end of each standoff mates with one of the plurality of studs and is positioned to span one of said mounting holes of said module and the second end of said standoffs further projecting through a clearance hole of said printed circuit board;
   c) a washer for mating with the second end of the printed circuit board, said washer having an annular configuration with an internal diameter larger than the diameter of said standoffs, and an outside diameter greater than the diameter of said clearance hole of said circuit board; and
   d) a fastener for securing the washer to the printed circuit board, said fastener mating with the second end of said standoff;
   whereby said assembly provides a common mechanical support for both a mechanical joint supporting said circuit board and a mechanical joint between a power module and a heat sink.

* * * * *